(12) United States Patent
Gupta et al.

(10) Patent No.: US 10,566,980 B2
(45) Date of Patent: Feb. 18, 2020

(54) USE OF A RAW OSCILLATOR AND FREQUENCY LOCKED LOOP TO QUICKEN LOCK TIME OF FREQUENCY LOCKED LOOP

(71) Applicant: STMicroelectronics International N.V., Schiphol (NL)

(72) Inventors: Nitin Gupta, Kurukshetra (IN); Jeet Narayan Tiwari, Greater Noida (IN)

(73) Assignee: STMicroelectronics International N.V., Schipol (NL)

( * ) Notice: Subject to any disclaimer, the term of this patent is extended or adjusted under 35 U.S.C. 154(b) by 36 days.

(21) Appl. No.: 15/924,584

(22) Filed: Mar. 19, 2018

(65) Prior Publication Data

US 2019/0288693 A1    Sep. 19, 2019

(51) Int. Cl.
*H03L 7/07* (2006.01)
*H03L 7/099* (2006.01)
*H03L 7/095* (2006.01)

(52) U.S. Cl.
CPC ............ *H03L 7/07* (2013.01); *H03L 7/095* (2013.01); *H03L 7/0992* (2013.01); *H03L 2207/50* (2013.01)

(58) Field of Classification Search
CPC ....................................................... H03L 7/07

USPC ............................................................. 331/2
See application file for complete search history.

(56) References Cited

U.S. PATENT DOCUMENTS

| 6,229,400 | B1* | 5/2001 | McCollough | H03C 3/095 |
| | | | | 331/17 |
| 7,898,343 | B1* | 3/2011 | Janesch | H03L 7/087 |
| | | | | 331/11 |
| 2016/0269035 | A1* | 9/2016 | Wentzloff | H03L 7/087 |

\* cited by examiner

*Primary Examiner* — Joseph Chang
(74) *Attorney, Agent, or Firm* — Crowe & Dunlevy

(57) ABSTRACT

Disclosed is a method of locking a locked loop quickly, including receiving an input signal having an input frequency, and generating an intermediate signal having an intermediate frequency intended to be equal to a geometric mean of the input frequency and a desired frequency, but not equal. Results of division of the desired output frequency by the intermediate frequency are estimated, producing a first divider value. A first locked loop utilizing a controllable oscillator is activated. A divider value of the first locked loop is set to the first divider value, and the intermediate signal is provided to the first locked loop, so that when the first locked loop reaches lock, the controllable oscillator produces the desired frequency. When the first locked loop reaches lock, a second locked loop that utilizes the controllable oscillator is activated, the first locked loop is deactivated, and generation of the intermediate signal is ceased.

17 Claims, 2 Drawing Sheets

USE OF A RAW OSCILLATOR AND FREQUENCY LOCKED LOOP TO QUICKEN LOCK TIME OF FREQUENCY LOCKED LOOP

TECHNICAL FIELD

This disclosure is directed to the field of locked loop circuits, and, in particular, to techniques and circuits for quickening the lock time of a phase locked loop with a high loop divider value by using a frequency locked loop with a lower loop divider value to set the controllable oscillator of the phase locked loop to the desired output frequency.

BACKGROUND

Locked loop circuits, such as phase locked loop circuits, are basic components of radio, wireless, and telecommunication technologies. A phase locked loop (PLL) is a control system that generates an output signal having a phase related to the phase of an input signal.

A sample PLL is now described with reference to FIG. 1. The PLL 50 includes a variable frequency oscillator 58 (here, a voltage controller oscillator VCO), a divider 60, a phase frequency detector (PFD) 52, a charge pump 54, and a loop filter 56. The VCO 58 generates a periodic signal Fout, and the divider 60 divides the frequency of the output signal Fout to produce signal Fdiv. The phase frequency detector 52 compares the phase of that signal Fdiv with the phase of a reference periodic signal Fref, and generates the control signals UP, DN for the charge pump 54 based upon that phase comparison. When the phase of the signal Fref leads the phase of the signal Fdiv, the control signal UP is asserted at a logic high, while the control signal DN remains at a logic low and the voltage Vp at the output of the charge pump 54 increases. Conversely, when the phase of the signal Fref lags the phase of the signal Fdiv, the control signal DN is asserted at a logic high, while the control signal UP remains at a logic low and the voltage Vp does not change. When the phase of the signal Fref and the phase of the signal Fdiv match, neither UP nor DN are asserted at a logic high.

The voltage Vp output from the charge pump 54 is used to generate a control signal Vc for the VCO 58, by passing voltage Vp through the loop filter 56, which is typically a low pass filter operating to extract the low frequency content of the voltage Vp. The VCO 58, in response to the control signal, adjusts the phase and frequency of the output signal Fout. When UP is asserted, the voltage of the control signal Vc increases and the frequency of Fout also increases. Conversely, when DN is asserted, the voltage of the control signal Vc decreases and the frequency of Fout also decreases. Since the phase of the signal Fref cannot both lead and lag the phase of the signal Fdiv, the phase frequency detector 52 will not simultaneously assert both UP and DN.

In addition to synchronizing signals, the PLL 50 can track an input frequency, or it can generate a frequency that is a multiple (or fraction) of the input frequency.

Such phase locked loops are widely employed in radio, telecommunications, computers and other electronic applications. They can be used to provide inputs to circuits that demodulate a signal, recover a signal from a noisy communication channel, generate a stable frequency at multiples of an input frequency (frequency synthesis), or distribute precisely timed clock pulses in digital logic circuits such as microprocessors. Since a single integrated circuit can provide a complete phase locked loop building block, phase locked loops are widely used in modern electronic devices, with output frequencies from a fraction of a hertz up to many gigahertz.

In some cases, it may be desirable for a phase locked loop to multiply a relatively low reference frequency Fref, on the order of tens of kilohertz, to a relatively high output frequency Fout, on the order of tens of megahertz. While phase locked loops capable of performing this functionality exist, the time to achieve lock for such phase locked loop circuits is about 1 millisecond, which may be too long or certain applications requiring a fast wake up time.

Therefore, further development work on PLL circuits is needed.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein are a variety of embodiments, some being device aspects, some being method aspects. A first embodiment is directed to a method including receiving an input signal having an input frequency, and generating an intermediate signal having an intermediate frequency intended to be equal to a geometric mean of the input frequency and a desired output frequency, but that is not actually equal to the geometric mean of the input frequency and the desired output frequency. A result of division of the desired output frequency by the intermediate frequency is estimated so to produce a first locked loop divider value. A first locked loop that utilizes a controllable oscillator is activated. A divider value of the first locked loop is set to the first locked loop divider value, and the intermediate signal is provided to the first locked loop as input, so that when the first locked loop reaches lock, the controllable oscillator is producing an output signal with the desired output frequency. When the first locked loop reaches lock, a second locked loop that utilizes the controllable oscillator is activated, the first locked loop is deactivated, and the intermediate signal is ceased to be generated.

The result of the division of the desired output frequency by the intermediate frequency may in some cases be estimated by counting a number of cycles of the intermediate frequency in the input frequency, and dividing a second locked loop divider value used by the second locked loop by that.

In another embodiment, a circuit has an input receiving a reference signal having an input frequency, and an oscillator configured to generate an intermediate signal with a frequency intended to be equal to a geometric mean of the input frequency and a desired output frequency. The circuit includes calibration logic configured to count a number of cycles of an actual frequency of the intermediate signal in one cycle of the input frequency, and generate a new loop division number by dividing a loop division number, that would produce the desired output frequency when multiplied by the input frequency, by the count. The circuit also includes a locked loop circuit with a current controlled oscillator (CCO), and a frequency locked loop (FLL) portion coupled to the current controlled oscillator, receiving as input the intermediate signal and the new loop division number, and configured to cause the CCO to generate a FLL output signal having an output frequency close to or equal to desired output frequency. A phase locked loop (PLL) portion of the locked loop circuit is coupled to the CCO and causes the CCO to generate a PLL output signal as having a frequency equal to the desired output frequency and having a phase locked to a phase of the reference signal.

Control circuitry may, in a startup phase, switch on the FLL portion and the oscillator, wait for the FLL to lock such that the frequency of the FLL output signal generated by the CCO is equal to the desired output frequency, and when the FLL locks, couple the PLL to the CCO and switch off the FLL and the oscillator.

The calibration logic may receive as input the reference signal and the intermediate signal, count a number of cycles of the actual frequency of the intermediate signal in the input frequency, and output that count. The calibration logic may also receive the count and the loop division number, and generate a new loop division number as the loop division number divided by the count.

In another embodiment, a circuit includes an input receiving a reference signal having an input frequency, an oscillator configured to generate an intermediate signal having a frequency intended to be a geometric mean of the input frequency and a desired output frequency, a controllable oscillator, and an oscillator control circuit configured to generate an oscillator control signal for the controllable oscillator. A phase locked loop (PLL) is coupled to the input and to the oscillator control circuit, and the PLL utilizes the controllable oscillator and controls the oscillator control circuit to cause multiplication of the input frequency by a PLL loop division number. Calibration logic is coupled to the input and to the oscillator, and is configured to count a number of cycles of an actual frequency of the intermediate signal in the input frequency, and to generate a new loop division number by dividing the PLL loop division number by the count. A frequency locked loop (FLL) is coupled to the calibration logic, and utilizes the controllable oscillator and controls the oscillator control circuit to cause multiplication of the frequency of the intermediate signal by a FLL loop division number. A switch couples the PLL to the oscillator control circuit when the FLL achieves lock.

The controllable oscillator may be a current controlled oscillator (CCO). In addition, the oscillator and FLL may be configured to be switched off after the switch couples the PLL to the oscillator control circuit. The PLL may be a digital PLL, and the FLL may be a digital FLL. In addition, the oscillator control circuit may include, at least in part, a digital to analog converter (DAC). The FLL may generate, as output, a digital control word for the DAC.

The calibration logic, upon the FLL achieving lock, may close the switch, enable the PLL, disable the oscillator, and disable the FLL. The calibration logic, in an initial startup phase, may disable the PLL, open the switch, enable the oscillator, and enable the FLL.

Another method embodiment is directed to a method of operating a phase locked loop (PLL). This method includes receiving a reference signal for the PLL having a reference frequency, and generating an intermediate reference signal having intermediate reference frequency between the reference frequency and a desired output frequency of an output signal of the PLL. This method further includes passing the intermediate reference signal to a frequency locked loop (FLL) configured to generate an intermediate output signal having the desired output frequency, from the intermediate reference signal, thereby causing a controllable oscillator of the frequency locked loop to be set to produce the desired output frequency. Finally, this method includes coupling the controllable oscillator of the FLL to the PLL, and activating the PLL to cause the PLL to generate the output signal as having the desired output frequency.

Yet another method embodiment is directed to a method of quickening lock time of a phase locked loop (PLL) having a first loop divider value. This method includes setting an output frequency of a controllable oscillator to a desired output frequency for an output signal of the PLL using a frequency locked loop (FLL) with a second loop divider value lower than the first loop divider value, coupling the controllable oscillator to the PLL, activating the PLL, and deactivating the FLL.

DETAILED DESCRIPTION

One or more embodiments will be described below. These described embodiments are only examples of implementation techniques, as defined solely by the attached claims. Additionally, in an effort to provide a focused description, irrelevant features of an actual implementation may not be described in the specification.

Figure 1:
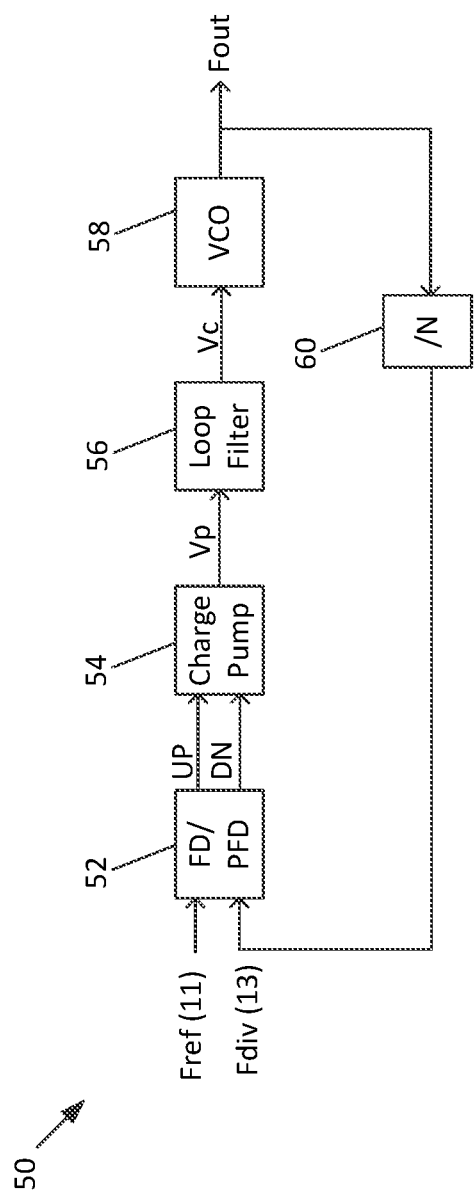
FIG. 1 is a schematic block diagram of a generic phase locked loop utilizing a charge pump.
Figure 2:
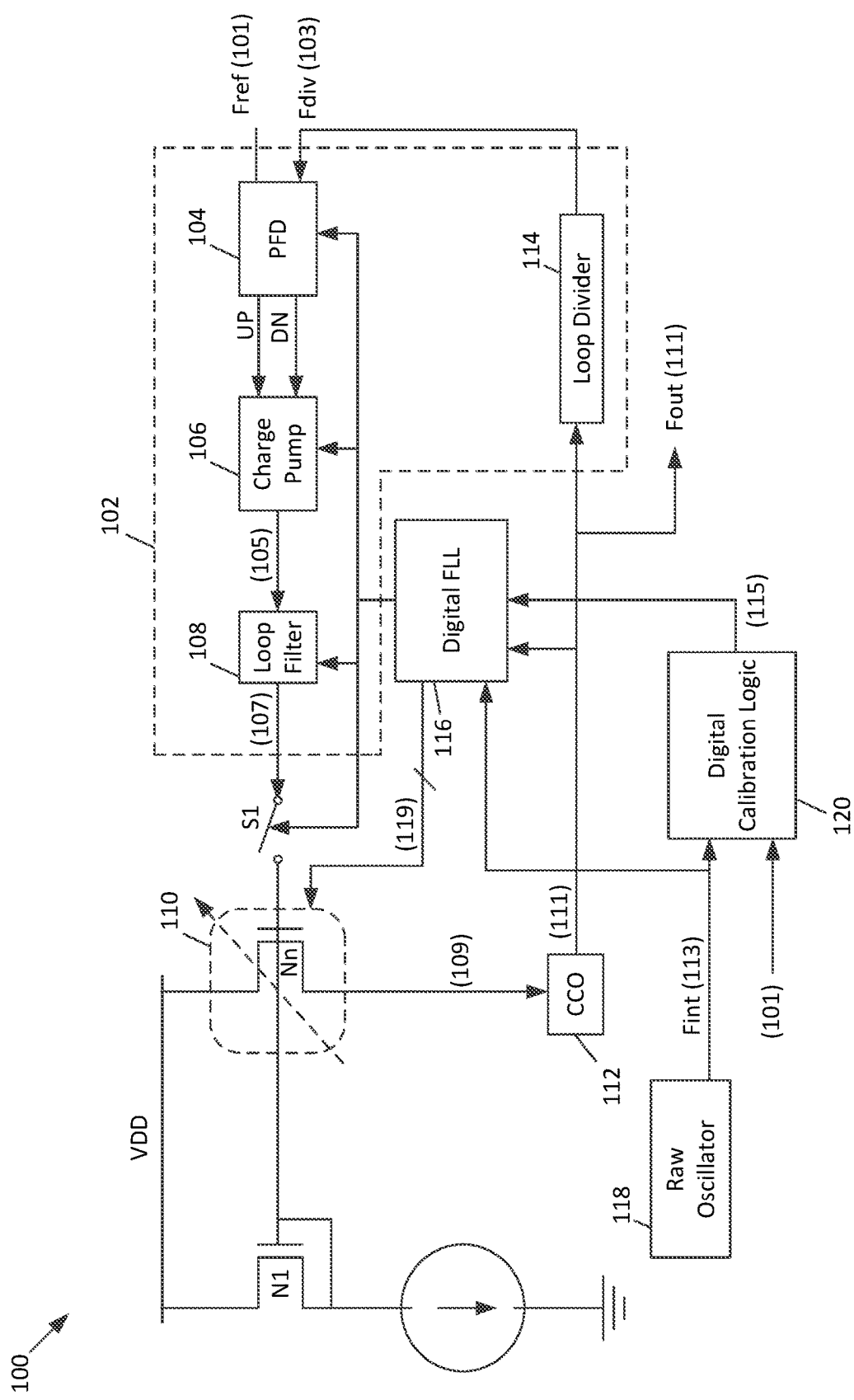
FIG. 2 is a schematic block diagram of a phase locked loop, together with a digital frequency locked loop for configuration of the oscillator used by the phase locked loop, in accordance with this disclosure.

With reference to FIG. 2, a circuit 100 is now described. The circuit 100 includes a phase locked loop (PLL) 102 receiving as input an input signal 101 having an input frequency Fref, and a feedback signal having a feedback frequency Fdiv. It is desired for the PLL 102 to multiply the input frequency Fref to produce an output signal 111 having an output frequency Foutput equal to a desired frequency Fdesired.

As understood to those of skill in the art, the division factor FDIV used by the loop divider 114 in a PLL determines the multiplication factor. Therefore, the division factor FDIV is equal to Fdesired/Fref. For a sample input frequency Fref of 32 KHz to produce a desired frequency Fdesired of 72 MHz, the division factor Fdiv would therefore be 2250. While the PLL 102 is capable of operating with this division factor, the time to reach lock (for Foutput to equal Fdesired) is about 1 millisecond. This is undesirable for some applications, as a lock time of around 100 μs would be preferable. Therefore, the Inventors have devised the following scheme to utilize a digital frequency locked loop 116 (digital FLL) to quickly set the current controlled oscillator (CCO) 112 used by the PLL 102 to the desired frequency Fdesired, so as to enable quicker lock of the PLL 102.

A raw oscillator 118 is employed generate an intermediate signal 113 having an intermediate frequency Fint intended to be equal to a geometric mean of the input frequency Fref and the desired output frequency Fdesired. However, the raw oscillator 118 is not ideal, and therefore the frequency Fint of the intermediate signal 113 will not actually be equal to this geometric mean.

The intermediate signal 113 is provided to digital calibration logic 120, which counts the number of cycles of the intermediate signal 113 that occur in one cycle of the input frequency Fref, and generates a division factor FDIV2 by dividing this count by the division factor FDIV for the PLL 102. The division factor FDIV2 is provided as signal 115 to the digital FLL 116, which generates a control signal 119 to control the voltage-to-current converter 110, which in turn generates a CCO control signal 109 for controlling the current controlled oscillator 112. The voltage-to-current converter 110 contains multiple NMOS transistors Nn in a current mirror relationship with NMOS transistor N1, and the control signal 119 selects how many of the NMOS transistors Nn of the voltage-to-current converter 110 are turned on.

The digital FLL 116 counts the number of cycles of output frequency Foutput of the output signal 111 in the frequency Fint of the intermediate signal 113 produced by the raw oscillator 118, and compares this count with FDIV2. Based on this comparison, the digital FLL 116 generates a control signal 119 for the voltage-to-current converter 110, which in turn adjusts the CCO control signal 109. When the number of cycles of the output frequency Foutput of the output signal 111 in the frequency Fint of the intermediate signal 113 is equal to FDIV2, the digital FLL 116 has locked. At this point, logic circuitry in the digital FLL 116 enables the phase frequency detector PFD 104, charge pump 106 and loop filter 108, and closes switch S1 to short the output 107 of the loop filter 108 to the voltage-to-current converter 110. Also, at this point, logic circuitry in the digital FLL 116 switches off the raw oscillator 118 and digital FLL 116, eliminating the power consumption thereby.

Since switch S1 is closed, shorting the output 107 of the loop filter 108 to the voltage-to-current converter 110, the PLL 102 is now active, and controls the voltage-to-current converter 110 to thereby generate the appropriate CCO control signal 109 to achieve PLL lock. Since operation of the PLL 102 begins with the CCO 112 as already set to the desired frequency Fdesired, lock of the PLL 102 occurs quickly. Since FDIV2 is much less than FDIV, the time for the digital FLL 116 to lock is much less than the PLL 102 would take in the absence of the digital FLL 116 having pre-set the CCO 112 to Fdesired.

Consider an example of operation of the circuit 100 in which it is desired for the PLL 102 to produce a 72 MHz output signal (Fdesired) from a 32 KHz input signal (Fref). NDIV=Fdesired/Fref=72 MHz/32 KHz=2250. Therefore, NDIV for the PLL 102 is 2250. The geometric mean of the input frequency 32 KHz and the desired output frequency 72 MHz is calculated as $\sqrt{72\text{KHz} \ast 72\text{MHz}}=1.518$ MHz, although an approximation of $\sqrt{\text{FDIV}} \ast \text{Fref}$ may be used, which here would be calculated as $\sqrt{2250} \ast 32$ KHz=1.504 MHz. Assuming for the sake of example that the frequency Fint of the intermediate signal 113 turns out to be 1.2 MHz instead of ~1.5 MHz, the digital calibration logic 120 would divide Fint by the input frequency Fref, which here would be 1.2 MHz/32 KH=37.5. FDIV2 is then calculated as FDIV2=FDIV/37=2250/37.5=60. The FDIV2 value of 60 is then passed to the digital FLL 116. Since 60 is much smaller than 2250, as stated, the digital FLL 116 reaches lock quickly.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A method, comprising:
   receiving an input signal having an input frequency;
   configuring a raw oscillator to generate an intermediate signal as having a frequency equal to a geometric mean of the input frequency and a desired output frequency, but due to unideal behavior of the raw oscillator, the frequency of the intermediate signal as generated by the raw oscillator is not actually equal to the geometric mean of the input frequency and the desired output frequency;
   estimating a result of division of the desired output frequency by the frequency of the intermediate signal to produce a first locked loop divider value;
   activating a first locked loop that utilizes a controllable oscillator;
   setting a divider value of the first locked loop to the first locked loop divider value, and provide the intermediate signal to the first locked loop as input, so that when the first locked loop reaches lock, the controllable oscillator is producing an output signal with the desired output frequency; and
   when the first locked loop reaches lock, activate a second locked loop that utilizes the controllable oscillator, deactivate the first locked loop, and cease generating the intermediate signal.

2. The method of claim 1, wherein result of the division of the desired output frequency by the frequency of the intermediate signal is estimated by counting a number of cycles of the frequency of the intermediate signal in the input frequency, and dividing a second locked loop divider value used by the second locked loop by that.

3. A circuit, comprising
   an input receiving a reference signal having an input frequency;
   an oscillator configured to generate an intermediate signal having a frequency configured to be equal to a geometric mean of the input frequency and a desired output frequency;
   calibration logic configured to:
      count a number of cycles of an actual frequency of the intermediate signal in one cycle of the input frequency; and
      generate a new loop division number by dividing a loop division number, that would produce the desired output frequency when multiplied by the input frequency, by the count;
   a locked loop circuit comprising:
      a current controlled oscillator (CCO);
      a frequency locked loop (FLL) portion coupled to the CCO, receiving as input the intermediate signal and the new loop division number, and configured to cause the CCO to generate a FLL output signal having an output frequency close to or equal to desired output frequency;
      a phase locked loop (PLL) portion coupled to the CCO and configured to cause the CCO to generate a PLL output signal having a frequency equal to the desired output frequency and having a phase locked to a phase of the reference signal.

4. The circuit of claim 3, further comprising control circuitry configured, in a startup phase, to:
   switch on the FLL portion and the oscillator;
   wait for the FLL to lock such that the frequency of the FLL output signal generated by the CCO is equal to the desired output frequency; and
   when the FLL locks, couple the PLL to the CCO and switch off the FLL and the oscillator.

5. The circuit of claim 3, wherein the calibration logic is configured to:

receive as input the reference signal and the intermediate signal, count a number of cycles of the actual frequency of the intermediate signal in the input frequency, and output that count; and receive the count and the loop division number, and generate a new loop division number as the loop division number divided by the count.

6. A circuit, comprising:

an input receiving a reference signal having an input frequency;

an oscillator configured to generate an intermediate signal having a frequency configured to be equal to a geometric mean of the input frequency and a desired output frequency;

a controllable oscillator;

an oscillator control circuit configured to generate an oscillator control signal for the controllable oscillator;

a phase locked loop (PLL) coupled to the input and to the oscillator control circuit, the PLL utilizing the controllable oscillator and controlling the oscillator control circuit to cause multiplication of the input frequency by a PLL loop division number;

calibration logic coupled to the input and to the oscillator, the calibration logic configured to count a number of cycles of an actual frequency of the intermediate signal in the input frequency, and to generate a new loop division number by dividing the PLL loop division number by the count;

a frequency locked loop (FLL) coupled to the calibration logic, the FLL utilizing the controllable oscillator and controlling the oscillator control circuit to cause multiplication of the frequency of the intermediate signal by a FLL loop division number;

a switch coupling the PLL to the oscillator control circuit when the FLL achieves lock.

7. The circuit of claim 6, wherein the controllable oscillator is a current controlled oscillator (CCO).

8. The circuit of claim 6, wherein the oscillator and FLL are configured to be switched off after the switch couples the PLL to the oscillator control circuit.

9. The circuit of claim 6, wherein the PLL comprises a digital PLL.

10. The circuit of claim 6, wherein the FLL comprises a digital FLL.

11. The circuit of claim 10, wherein the oscillator control circuit comprises, at least in part, a digital to analog converter (DAC); and wherein the FLL generates, as output, a digital control word for the DAC.

12. The circuit of claim 6, wherein the calibration logic, upon the FLL achieving lock, closes the switch, enables the PLL, disables the oscillator, and disables the FLL.

13. The circuit of claim 6, wherein the calibration logic, in an initial startup phase, disables the PLL, opens the switch, enables the oscillator, and enables the FLL.

14. A method of operating a phase locked loop (PLL), comprising:

receiving a reference signal for the PLL having a reference frequency;

generating an intermediate reference signal having intermediate reference frequency between the reference frequency and a desired output frequency of an output signal of the PLL;

passing the intermediate reference signal to a frequency locked loop (FLL) configured to generate an intermediate output signal having the desired output frequency, from the intermediate reference signal, thereby causing a controllable oscillator of the frequency locked loop to be set to produce the desired output frequency; and coupling the controllable oscillator of the FLL to the PLL, and activate the PLL to cause the PLL to generate the output signal as having the desired output frequency.

15. The method of claim 14, wherein the intermediate reference signal is generated such that the intermediate reference frequency is a geometric mean between the reference frequency and the desired output frequency.

16. A method of quickening lock time of a phase locked loop (PLL) having a first loop divider value, the method comprising:

using an oscillator to generate an intermediate reference signal having an intermediate reference frequency between a desired output frequency of an output signal of the PLL and a reference frequency of a reference signal fed to the PLL as input;

setting an output frequency of a controllable oscillator to the desired output frequency for the output signal of the PLL using a frequency locked loop (FLL) with a second loop divider value lower than the first loop divider value, wherein the second loop divider value is set such that the intermediate reference frequency multiplied by the second loop divider value yields the desired output frequency;

providing the intermediate reference signal to the FLL;

coupling the controllable oscillator to the PLL; and activating the PLL and deactivating the FLL.

17. The method of claim 16, wherein the intermediate reference frequency is a geometric mean between the reference frequency and the desired output frequency.

\* \* \* \* \*